United States Patent [19]

Young

[11] Patent Number: 5,084,839
[45] Date of Patent: Jan. 28, 1992

[54] VARIABLE LENGTH SHIFT REGISTER

[75] Inventor: William R. Young, Palm Bay, Fla.

[73] Assignee: Harris Corporation, Melbourne, Fla.

[21] Appl. No.: 475,007

[22] Filed: Feb. 5, 1990

[51] Int. Cl.[5] .............................................. G11C 21/00
[52] U.S. Cl. .................................... 365/73; 365/189.04; 365/189.12
[58] Field of Search ................ 365/78, 189.04, 189.12, 365/230.09; 377/70

[56] References Cited

U.S. PATENT DOCUMENTS

| | | | |
|---|---|---|---|
| 3,763,480 | 10/1973 | Weimer | 365/78 |
| 3,772,658 | 11/1973 | Sarlo | 365/78 |
| 4,193,121 | 3/1980 | Fedida et al. | 365/78 |
| 4,903,242 | 2/1990 | Hamaguchi et al. | 365/78 |

OTHER PUBLICATIONS

Intersil ISP9500.

*Primary Examiner*—Terrell W. Fears
*Attorney, Agent, or Firm*—Barnes & Thornburg

[57] ABSTRACT

Forming the shift register as a plurality of memory locations in a memory array where the input port for writing into the memory and the output port for reading out of the memory are sequenced along the array. Thus the input and output ports are shifted with respect to the array instead of the information shifting with respect to fixed input and output ports. The length or number stages of the shift register may be varied by changing the displacement or offset of the output or reading port to the input or writing port in the sequence.

16 Claims, 3 Drawing Sheets

STAGE

FIG. 4

| CLOCK | 1 | 2 | 3 | --- | N-1 | N | N+1 | N+2 | --- | N+M-1 | N+M |
|---|---|---|---|---|---|---|---|---|---|---|---|
| 1 | $R_1$ | | | | | $W_1$ | | | | | |
| 2 | | $R_2$ | | | | $W_1$ | $W_2$ | | | | |
| 3 | | | $R_3$ | | | $W_1$ | $W_2$ | $W_3$ | | | |
| ⋮ | | | | | | | | | | | |
| N | | | | | | $R_N$ | $W_2$ | $W_3$ | | $W_N$ | |
| N+1 | | | | | | $W_1$ | $R_{N+1}$ | $W_3$ | | $W_N$ | $W_{N+1}$ |
| N+2 | $W_{N+2}$ | | | | | $W_1$ | $W_2$ | $R_{N+2}$ | | $W_N$ | $W_{N+1}$ |
| ⋮ | | | | | | | | | | | |
| N+M-1 | $W_{N+2}$ | $W_{N+3}$ | | | | $W_1$ | $W_2$ | $W_3$ | | $R_{N+M-1}$ | $W_{N+1}$ |
| N+M | $W_{N+2}$ | $W_{N+3}$ | | | $W_{N+M}$ | $W_1$ | $W_2$ | $W_3$ | | $W_N$ | $R_{N+M}$ |
| N+M+1 | $R_{N+M+1}$ | $W_{N+3}$ | | | $W_{N+M}$ | $W_{N+M+1}$ | $W_2$ | $W_3$ | | $W_N$ | $W_{N+1}$ |

FIG. 5

| | 1 | 2 | 3 | --- | N-1 | N | N+1 | N+2 | --- | N+M-1 | N+M |
|---|---|---|---|---|---|---|---|---|---|---|---|
| 1 | $R_1$ | | | | | $W_1$ | | | | | |
| 2 | $W_2$ | $R_2$ | | | | $W_1$ | | | | | |
| 3 | $W_2$ | $W_3$ | $R_3$ | | | $W_1$ | | | | | |
| ⋮ | | | | | | | | | | | |
| N-1 | $W_2$ | $W_3$ | $W_4$ | | $R_{N+1}$ | $W_1$ | | | | | |
| N | $W_2$ | $W_3$ | $W_4$ | | $W_N$ | $R_N$ | | | | | |
| N+1 | $R_{N+1}$ | $W_3$ | $W_4$ | | $W_N$ | $W_{N+1}$ | | | | | |

FIG. 8

| | 1 | 2 | 3 | --- | N-1 | N | N+1 | N+2 | --- | N+M-1 | N+M | REG |
|---|---|---|---|---|---|---|---|---|---|---|---|---|
| 1 | $R_1$ | | | | | | | | | | | $W_1$ |
| 2 | $W_2$ | $R_2$ | | | | | | | | | | $W_1$ |
| 3 | $W_2$ | $W_3$ | $R_3$ | | | | | | | | | $W_1$ |
| ⋮ | | | | | | | | | | | | |
| N-1 | $W_2$ | $W_3$ | $W_4$ | | $R_{N-1}$ | | | | | | | $W_1$ |
| N | $W_2$ | $W_3$ | $W_4$ | | $W_N$ | | | | | | | $R_N$ |
| N+1 | $R_{N+1}$ | $W_3$ | $W_4$ | | $W_N$ | | | | | | | $W_{N+1}$ |

VARIABLE LENGTH SHIFT REGISTER

BACKGROUND AND SUMMARY OF THE INVENTION

The present invention relates generally to shift registers and more specifically to variable length shift registers.

Shift registers are serial devices wherein data is inputted in the first stage and is progressively transferred down the length of the shift register to the last stage. Prior art shift registers have been built out of a plurality of flip flops wherein the data is provided at the data input D of the flip flop is connected to the data output Q of the previous flip flop.

Techniques in the prior art to vary the length of the shift register have included selectively changing the input port in the cascaded connected flip flops or in the alternative selectively changing the output port. As illustrated in FIG. 1, each of the stages 1 through N through N+M has input logic whose output is connected to the terminal D of the flip flop and whose input combines the data input terminal, the Q output of the previous stage and a select signal for that stage. One of the select signals activates its logic to select which stage will become the input terminal of the shift register with the N+M stage always being the output stage. If stage 1 is activated as the input terminal, the shift register has N+M stages. If the N stage is selected as the input terminal then the shift register has M+1 stages.

As an alternative, the prior art of FIG. 2 has the input connected to the first stage 1 and the output Q of each of the flip flops connected through a switch or logic gate to the data output. Selector control signal at the logic gate selects one of the output stages output Q to provide the output data signal and thereby vary the length of the shift register. If the N output logic gate is selected, the shift register has a length of N stages. If the N+M output logic gate is selected, the shift register has a length of N+M.

Each of the shift registers of FIGS. 1 and 2 require decoding logic, normally AND gates to provide the select signals. This increases the overhead.

In use of these prior art systems, the shifting of data between the shift registers each includes a time delay for the transmission. Similarly a flip flop has an input and output stage and therefore includes a substantial number of transistors. Also since the data is shifting, all stages are active or powered during each cycle.

In the shift register of FIGS. 1 and 2, two cycles are required. The first cycle clocks data into the flip flop and the second cycle clocks it out. This adds an additional delay to the transmission of the information through the shift register.

Thus it is an object of the present invention to provide a shift register of reduced size.

Another object of the present invention is to provide a shift register with reduced time delay.

Yet still another object of the present invention is to provide a variable length shift register with a minimum number of transistors and time delay.

A still even further object of the present invention is to provide a variable length shift register of reduced area.

An even further object is to provide a shift register having reduced power consumption.

These and other objects of the invention are attained by forming the shift register as a plurality of memory locations in a memory array where the input port for writing into the memory and the output port for reading out of the memory are sequenced along the array. Thus the input and output ports are shifted with respect to the array instead of the information shifting with respect to fixed input and output ports and only the input and the output cell are active or consuming power at each cycle. The length or number stages of the shift register may be varied by changing the displacement or offset of the output or reading port to the input or writing port in the sequence. By using dual port memories, the reading cycle and writing cycle may be performed simultaneously.

Where the number of desired stages is less than the size of the memory, the sequencing may continue across the length of the memory and then the reading and writing may be restarted respectively as they reach the end of the array. Alternatively, restarting may be at the position in the array equal to the length of the desired shift register stages. The sequencing may be performed by a resettable counter or shift register instead of the logic of the prior art, thereby reducing overhead. Using the second method where the restart is at the desired length of the shift register, the stage being written into is adjacent the stage being read. Using a dual port memory cell, a single select line may be used to simultaneously select reading one cell and writing into an adjacent cell. Where a single select line is used for simultaneously reading and writing, a separate storage device or register is provided and it is written into when the first stage is being read from and the register is read from when the last stage is being written into.

Other objects, advantages and novel features of the present invention will become apparent from the following detailed description of the invention when considered in conjunction with the accompanying drawings.

BRIEF DESCRIPTION OF THE DRAWINGS

FIG. 4 is a table illustrating one method of operating the shift register of FIG. 3;

FIG. 5 is a table illustrating a second method of operating the shift register of FIG. 3;

FIG. 8 is a table illustrating the operation of the shift register of FIG. 7.

DETAILED DESCRIPTION OF THE DRAWINGS

Figure 1:
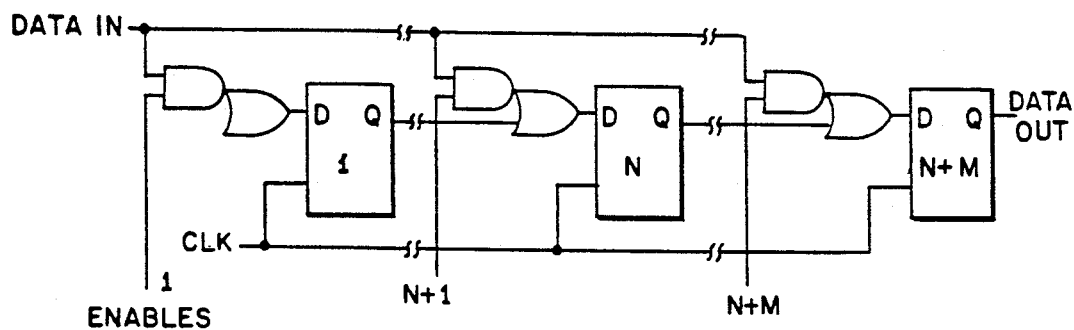
FIG. 1 is a schematic of a variable input port shift register of the prior art.
Figure 2:
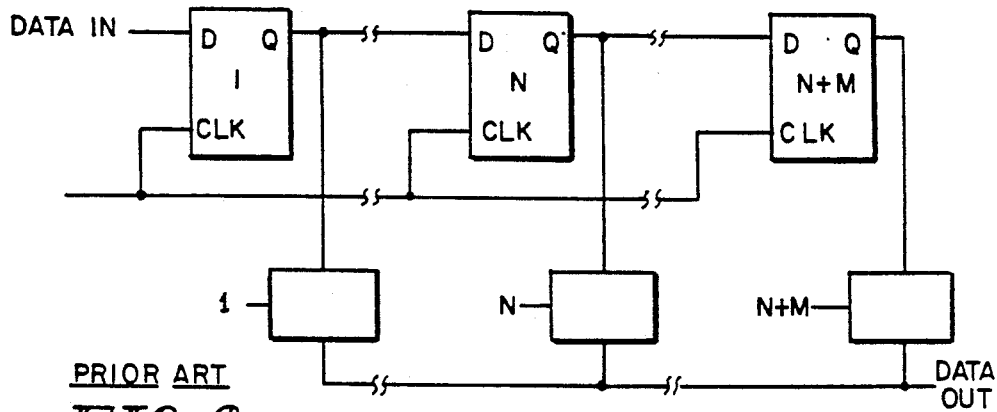
FIG. 2 is a schematic of a variable output port shift register of the prior art.
Figure 3:
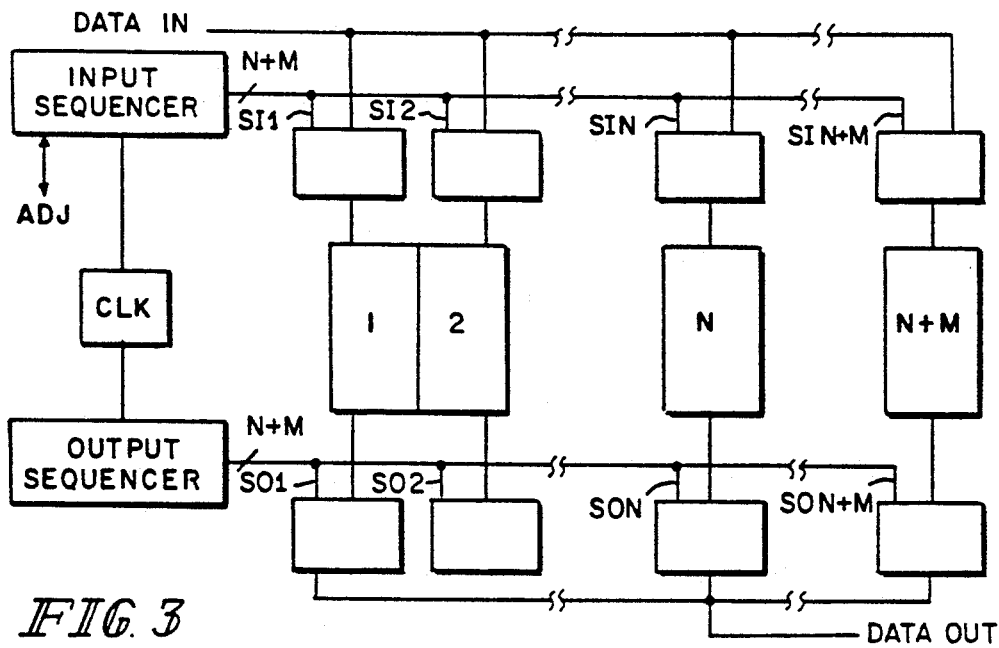
FIG. 3 is a schematic of a variable length shift register incorporating the principles of the present invention.

A variable length shift register is illustrated in FIG. 3 including a plurality of memory cells 1 through N through N+M. For sake of clarity and simplicity, each memory cell is to represent a whole word. Data input lines are connected to the data inputs of each of the memory cells through a respective input gate or switch. The other input to the input switch is from an Input Sequencer which provides a gating signal to the input switch. The input switches may be a single transistor or any other form of logic. The Input Sequencer has N+M lines and provides appropriate signals SI1 to stage 1, SI2 to stage 2, SIN to stage N and SIN+M to stage N+M. The output of the memory cells are connected through individual output gates to a common data output. Also connected to the individual output gates are individual control lines from the Output Sequencer. The Output Sequencer provides an individual control SO1 to the output gate of the first stage, SO2 to the output gate of the second stage, SON to the output of the N stage and SON+M to the output of the N+M stage. A common clock drives the Input Sequencer and the Output Sequencer.

An adjustment is provided to the output sequencer to vary the length of the shift register by providing a specific value of offset or different stages between the input and the output sequencing which is equivalent to the number of desired stages of the shift register. The Input and Output Sequencer would generally both include resettable counters or shift registers wherein the difference in count would be the number of stages of the shift register. The operation of FIG. 3 includes the Input Sequencer and the Output Sequencer sequentially activating the input and output switches of the memories to write into and read out of the memories in a sequential manner.

To further understand the present invention, the operation will be discussed with respect to FIG. 4. To compare the present shift register against the prior art shift register, a read is considered an output signal and a write is an input signal. In the table of FIG. 4 it is configured as an N stage shift register. The method of operation will continue to shift the input and output terminals or ports along the full length of the memory which is M stages. During clock cycle 1, the Output Sequencer reads the contents of stage 1 while the Input Sequencer writes in stage N. At clock cycle 2, the Output Sequencer sequences to the second stage and reads its contents while the Input Sequencer sequences to write in the N+1 stage. This continues for N cycles at which point the data written at the Nth stage during clock cycle 1 is read and the Nth input is written in the N+M−1 stage. In the N+1 cycle, the Output Sequencer reads the N+1 stage and the Input Sequencer writes in the N+M stage. In this example, it is assumed that M is equal to N.

In the N+2 clock cycle, the N+2 stage is read while the first stage is written into. Thus at the N+1 clock cycle, the Input or Writing Sequencer is restarted while the Output or Reading Sequencer sequences across the stages. At the N+M clock cycle, the N+M stage is read while the N−1 stage is written into. At the N+M+1 stage, the Output or Reading Sequencer is restarted to read from the first stage while the Input or Writing Sequencer continues across the stages and writes in the N stage.

Although the size of the matrix at N+M where N=M is selected for example, any size of matrix may be used where the value N of the desired size of the shift register is variable or adjustable.

As an alternative to the sequencing of the chart of FIG. 4, the Input and Output Sequencers may be reset at the value N and only uses that portion of the matrix equal to the value N as illustrated in FIG. 5. Thus for the first cycle, the Nth stage is written into while the first stage is read. During cycle 2, the data is written into the first stage while data is read out of the second stage. Thus the Input or Write Sequencer was reset for the second cycle since it was to write in the N+1 stage. The sequence continues down to the Nth clock cycle wherein the Nth stage is read and the N−1 stage is written into. For the N+1 stage, the read exceeds the value N and therefore begins to read the first stage while the Nth stage is written into. As with the example of FIG. 4, the value N in FIG. 5 may be selected for any value within the range of 1 to N+M.

The counter in the Sequencers for FIG. 4 would be fixed length resettable counters and only the difference or offset between the stages need be provided in the input counter. For the implementation of FIG. 5, each of the counters would have to be of variable length or being able to be restarted at variable lengths and the appropriate difference or offset be provided to the input or writing counter.

Figure 6:
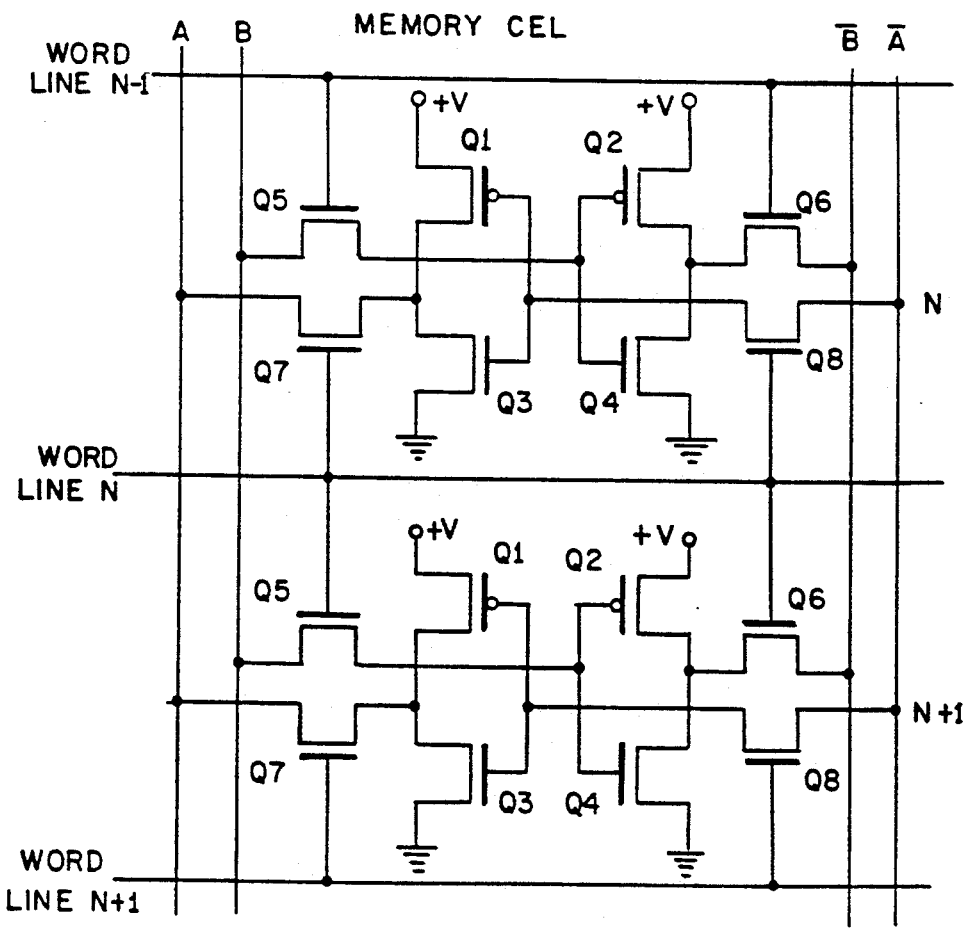
FIG. 6 is a schematic of a cell of the shift register of FIG. 7.

A review of FIG. 5 will indicate that other than the first and the N+1 clock cycle, adjacent cells are being written into and read from. Thus if the cells are dual ported having separate input and output ports, a common select or word line may be used for adjacent cells which activate the read port of one cell and the write port of the other simultaneously. Such cells are illustrated in FIG. 6 wherein the cell includes transistors Q1, Q2, Q3 and Q4 and have switches or gates Q5 and Q6 connected to the B and $\bar{B}$ output port and switches Q7 and Q8 connecting the cell to the A and $\bar{A}$ input port. The word or select line N is connected to the write or input transistors Q7 and Q8 of cell N and to the read or output port transistors Q5 and Q6 of cell N+1. Word line N−1 activates the output or read select transistors Q5 and Q6 of cell N. Thus a single word line activates adjacent cells simultaneously to write in the cell behind the cell being read.

The use of dual port cells to simultaneously read and write saves time since two separate cycles are not needed. Also there is a savings in overhead using a common select line for adjacent cells since only one select time per cell is needed instead of two for each dual port cell and only one decoder is needed.

Figure 7:
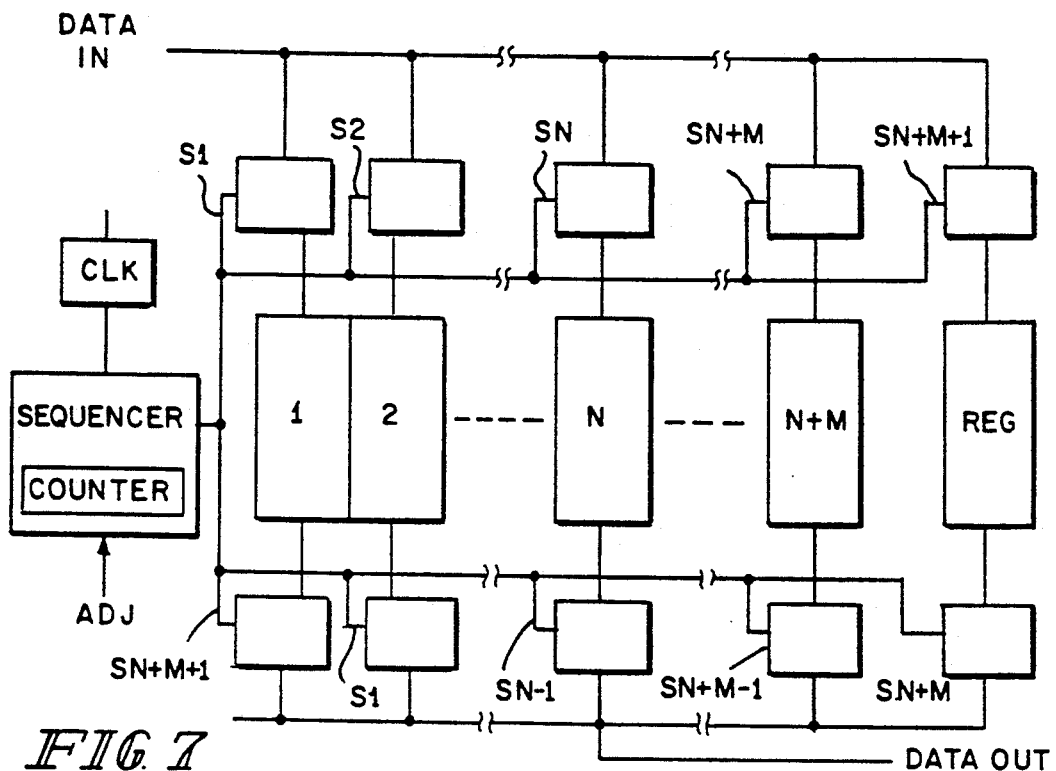
FIG. 7 is a schematic diagram of another variable length shift register incorporating the principles of the present invention.

Since it is desirable to use a dual port cell for simultaneous reading and writing and saving a cycle, a register as illustrated in FIG. 7 is provided to be written into during a clock cycle when the first stage is read and to be read from when the last stage is being written into. During clock cycle 1 the first stage is read from and the register is written into as illustrated in FIG. 8. This progresses as in the previous table of FIG. 5 to the Nth stage where the N−1 memory cell is written into and the register is read from. During cycle N+1 the first stage is read from and the data is written into the register. Since it is preferred to use dual port cells, only one select line can be activated at a time. Therefore separate control of the register is needed during reading from the first cell and writing from the last cell.

The specific structure as illustrated in FIG. 7 shows a separate register and a single Sequencer since only one select line is needed. The Sequencer provides a single select line which is illustrated schematically in FIG. 7. Thus the signal S1 which controls the reading from cell 2 also controls the writing into cell 1. The number associated with the S signal does not represent a clock pulse but that it is a common select line for adjacent cells. Thus they do not correspond to the subscript used in FIG. 8.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A shift register having a capacity of N stages where N is greater than two comprising:
   input means and output means;
   M+N stages of memory means for storing data;
   readings means for sequentially reading data from said memory means to said output means; and
   writing means for sequentially writing data from said input means into the N−1 memory stage from a last read memory means;
   whereby the reading and writing shifts with respect to stationary data in said memory means.

2. A shift register according to claim 1 wherein said reading means includes means for adjusting N to form a variable length shift register.

3. A shift register according to claim 1 wherein said reading and writing means includes restarting means for restarting the sequence of reading and writing respectively when the next memory means to be read and written respectively is the M+N+1 stage.

4. A shift register according to claim 3 wherein said restarting means includes a resettable counter for resettable sequencing said reading means and said writing means.

5. A shift register according to claim 1 wherein said reading means and said writing means each includes a counter resetting at M+N+1 for restarting the sequencing of said reading and writing means respectively.

6. A shift register according to claim 1 wherein said memory means is dual port and said reading means and writing means operate simultaneously.

7. A shift register comprising:
   input means and output means;
   N stages of memory means for storing data where N is greater than two;
   reading means for sequentially reading data from said memory means to said output means;
   writing means for sequentially writing data from said input means into an adjacent memory means stage prior to a last read memory means; and
   restarting means for restarting the sequence of reading when the previous memory means stage read from is the Nth stage and restarting the sequence of writing when the previous memory means stage written into is the Nth stage;
   whereby the reading and writing shifts with respect to stationary data in said memory means.

8. A shift register according to claim 7 wherein said restarting means includes a resettable counter for resettable sequencing said reading means and said writing means.

9. A shift register according to claim 7 wherein said memory means is dual port and said reading means and writing means operate simultaneously.

10. A shift register according to claim 9 including:
    a storage means for storing data of said Nth stage;
    and wherein said writing means writes data into said storage means when said reading means is reading a first stage memory means and said reading means reads data from said storage means when said writing means is writing in an N−1 stage memory means.

11. A shift register according to claim 9 wherein:
    adjacent memory means share a common select line which is connected to read select of one memory means and write select of the other memory means; and
    said reading and writing means are common and select said common select line.

12. A shift register according to claim 7 including:
    N+M stage of memory means for storing data; and
    wherein said restarting means is adjustable for varying the stage at which said sequence is restarted to produce a variable length shift register.

13. A shift register comprising:
    input means and output means;
    N stages of memory means having dual ports for storing data, wherein N is greater than two;
    a plurality of common select lines, one between each adjacent stage of memory means and connected to a read select of one memory means and a write select of the other memory means;
    select means for driving one of said select lines to read out data from one memory means to said output means and write data from said input means into an adjacent prior memory means simultaneously; and
    sequencing means for sequencing said select means from a first stage to an Nth stage and restarting with said first stage;
    whereby the reading and writing shifts with respect to stationary data in said memory means.

14. A shift register according to claim 13 wherein said sequencing means includes a resettable counter.

15. A shift register according to claim 13 including storage means for storing data of said Nth stage; and
    wherein said select means writes data into said storage means when it drives a select line to read a first stage memory means and reads data from said storage means when it drives a select line to write into an N−1 stage memory means.

16. A shift register according to claim 13 including:
    N+M stage of memory means for storing data; and
    wherein said sequencing means is adjustable for varying the stage at which said sequence is restarted to produce a variable length shift register.

* * * * *